US006649311B1

(12) United States Patent
Shirley et al.

(10) Patent No.: US 6,649,311 B1
(45) Date of Patent: Nov. 18, 2003

(54) COLOR CHANGING COMPOSITION AND COLORING POLYMERIC ARTICLES MADE THEREFROM

(75) Inventors: Dianne Beth Shirley, Manchester (GB); Ian Malcolm Shirley, Manchester (GB); Ajay Haridas Popat, Manchester (GB); Martin Russell Edwards, Manchester (GB); Kevin Thomas McAloon, Manchester (GB); Herbert Benson Scher, Richmond, CA (US)

(73) Assignee: Vantico Limited, Cambridge (GB)

( * ) Notice: Subject to any disclaimer, the term of this patent is extended or adjusted under 35 U.S.C. 154(b) by 0 days.

(21) Appl. No.: 09/744,229

(22) PCT Filed: Jul. 23, 1999

(86) PCT No.: PCT/GB99/02362

§ 371 (c)(1),
(2), (4) Date: May 2, 2001

(87) PCT Pub. No.: WO00/07071

PCT Pub. Date: Feb. 10, 2000

(30) Foreign Application Priority Data

Jul. 25, 1998 (GB) .............................................. 9816181
Aug. 13, 1998 (GB) .............................................. 9817513

(51) Int. Cl.$^7$ .............................. G03F 7/00; G03C 9/08
(52) U.S. Cl. .............................. 430/15; 430/13; 430/18; 430/138; 430/292; 430/333; 430/335; 430/337; 430/339; 430/338; 264/401; 428/402.21; 428/402.22; 428/402.24; 428/403; 427/213.31
(58) Field of Search .............................. 430/138, 292, 430/333, 335, 337, 339, 338, 13, 15, 18; 428/402.21, 402.22, 402.24, 403; 427/213.31; 264/401

(56) References Cited

U.S. PATENT DOCUMENTS

| 3,883,298 | A | * | 5/1975 | Platt ................................... 8/2 |
| 4,489,017 | A | * | 12/1984 | Alberts et al. ................ 264/4.7 |
| 4,713,312 | A | * | 12/1987 | Adair et al. .................. 430/138 |
| 4,816,368 | A | * | 3/1989 | Skaggs ........................ 430/138 |
| 5,124,236 | A | * | 6/1992 | Yamaguchi et al. ...... 430/281.1 |
| 5,206,118 | A | * | 4/1993 | Sidney et al. ................ 430/343 |
| 5,500,040 | A | | 3/1996 | Fujinami ................... 106/21 A |
| 5,595,853 | A | | 1/1997 | Ono et al. ................... 430/138 |
| 5,677,107 | A | | 10/1997 | Neckers ....................... 430/269 |
| 5,942,554 | A | * | 8/1999 | Ren et al. ....................... 522/25 |
| 5,952,131 | A | * | 9/1999 | Kumacheva et al. ........ 430/138 |

FOREIGN PATENT DOCUMENTS

| JP | 07013330 | 1/1995 |
| WO | WP 9709168 | 3/1997 |

* cited by examiner

*Primary Examiner*—Cynthia Hamilton
(74) *Attorney, Agent, or Firm*—Proskauer Rose LLP; Tiffany A. Levato; Kristin H. Neuman

(57) ABSTRACT

A process is provided for producing a polymeric layer having a desired image thereon or a three dimensional article comprising a number of such layers in which a layer of a liquid photocurable composition which comprises photo colorable particles is cured by light and selected areas thereof are irradiated with light of a different dose, thereby forming the desired image which composition comprises particles dispersed in it which are micro-capsules containing a photosensitive color changing composition within a barrier layer which is substantially impermeable to the components of the color changing composition or are solid particles comprising an immobilized photosensitive color changing composition. The process permits the use of the same initiating mechanism to cure the resin and to change the color of the particles.

27 Claims, No Drawings

COLOR CHANGING COMPOSITION AND COLORING POLYMERIC ARTICLES MADE THEREFROM

THIS INVENTION RELATES TO colouring polymeric articles and materials for use therein.

It is known from our patent specification WO 97/09168 to colour regions of a polymeric layer or three dimensional polymeric article by curing a layer of a polymeric composition by exposing it to light, and irradiating a region of the layer with light of a different dose thereby effecting colour formation in the said region. Three dimensional articles may be produced by repeating the process on successive layers. A similar disclosure is given in U.S. Pat. No. 5,514,519.

Problems may arise in such a process however if the initiating mechanism for curing the resin and forming the colour is the same, for example if both are initiated by a free radical or ionic (e.g. a cationic) mechanism, as in this case the whole layer or article may be coloured to some extent. This can arise if the initiating system which is activated to cure the resin produces free radicals or ions capable of initiating colour formation; even if they are relatively inefficient in initiating colour formation the result may be aesthetically undesirable or if a block of resin containing a three dimensional coloured image is to be formed any colouration of the non-imaged parts of the block may at least partly obscure the image. If an image which comprises two or more colours is desired it may be difficult to provide enough different initiating systems to permit each colour to be formed independently of each other's colour and free from interference from the polymerisation initiator of the resin.

This invention comprises a process for producing a polymeric layer having a desired image thereon or a three dimensional article comprising a number of such layers in which a layer of a liquid photocurable composition which comprises photo colourable particles is cured by light and selected areas thereof are irradiated with light of a different dose, thereby forming the desired image which composition comprises particles dispersed in it which are micro-capsules containing a photosensitive colour changing composition within a barrier layer which is substantially impermeable to the components of the colour changing composition or are solid particles comprising an immobilised photosensitive colour changing composition. The barrier or solid state of the particles will also act to limit the passage of initiating species into the micro-capsule.

In this invention the initiation mechanism may be the same or different, but it is particularly suitable for cases in which the composition is both cured and coloured by cationic initiators; for example, epoxy resins may be so cured in the presence of micro-capsules containing cationically initiated colouring agents.

The colour changing composition suitably comprises a photo initiator and a colour former which becomes coloured, changes colour or becomes more intensely coloured when the photoinitiator is activated. It may alternatively become bleached.

If it is desired to use an initiator which is sensitive to the light used for curing, the particles, for example the barrier and/or contents of the microcapsule may comprise a light absorbing substance which absorbs at least part of such light. Initiation of full colour change will then require a greater dose of light in intensity or duration than is needed for curing.

The barrier of the microcapsule may be permeable to materials other than the components of the colour forming composition and it may be desirable in manufacture to treat the microcapsules with a substance, for example ammonia, to decolourise the contents.

The particles may if desired contain a small quantity of a base or other material to maintain them in a colourless state until a threshold level of radiation is encountered. This may suitably be introduced by using a barrier which is permeable to the base, which may be a lower (e.g. $C_{1-2}$) amine or preferably ammonia and exposing the microcapsules to the base. If they are produced in a coloured or slightly coloured condition this procedure may also enable them to be decolourised as aforesaid.

The dose of light may differ in intensity, duration or wavelength. For convenience and cost it may be preferred to carry out cure and colour changing using a common light source (UV lamp or UV laser such as He—Cd, Argon Ion, YAG etc.), for example a laser which may suitably be traversed at a slower rate over the area to be coloured.

The invention also comprises particles which comprise an immobilised photosensitive colour changing agent which are preferably micro-capsules which may be as previously described which comprise a barrier layer enclosing a photosensitive colour changing composition, the barrier layer being substantially impermeable to the components of the said composition. "Immobilised" means not capable of migrating outside the particle. Such particles may for example be included in preparations for protecting the skin from sun and be adapted to change colour, for example to red when a suitable limit of exposure to sunlight has been received. They may also be used in monitoring the exposure to light of substrates to be tested for resistance to light, or the exposure of patients to light in therapeutic treatments. They may also be used in novelty items, for example greetings cards in which a message or design appears on exposure to light.

The barrier is suitably a polyurea or aminoplast composition. Gelatin, gum arabic, polyvinyl alcohol or other materials may be used if desired however.

The microcapsules may be made in known manner, for example as taught in U.S. Pat. Nos. 2,739,456, 2,800,457, 3,755,190, 3,914,511, 3,796,669, 4,001,140, 4,087,376, 4,089,802 or 4,025,455.

Micro particles, e.g. microcapsules, of 1 to 50 microns average diameter may be used to provide good continuous colour with resolution that is required for sharp colour writing etc.

The barrier should be robust; it should not be readily breakable by pressure or exposure to light or to a photocurable resin in which it is intended to disperse it. The barrier should remain intact in the finished product after colour formation.

The photocurable and photocolourable composition may be made by dispersing the particles in a photocurable composition which is preferably curable to form a transparent solid and which is preferably free from colour forming materials. It may, however, be desired for example for aesthetic purposes to have a lightly coloured "background" to the image. We prefer to spray dry micro-capsules for example by evaporating the water from tiny droplets of an aqueous microcapsule suspension, as we have found spray dried microcapsules easy to disperse in such compositions. If desired a dispersing aid may be used to assist in dispersing them in the composition. In a photocurable photocolourable composition containing the particles, a colour stabiliser may be present in the particles and a longer wave-length photoinitiator may also be present in the resin if desired.

The light curable resin is preferably an epoxy, vinyl ether or acrylate resin or a mixture thereof. Such light curable resins are described in EP 605,361 EP 360,869, U.S. Pat. No. 4,156,035, WO 92/15620, EP 646,580, EP 425,441 A2, SMC 60102 and SMC 60093. Many light curable resins are commercially available, for example Cibatool XB5170, 5180, 5190, Somos 6110, 7110, RP cure 100 HC, Exactomer 2202 SF, HTG 324 and Stereocol H-N 9000 (He—Cd laser), Somos 6100, 7100, Cibatool SL 5410, 5180, Exactomer HTG 35X, and RP cure 100 AR (Argon ion laser) and Cibatool SL 5510, 5190, SL 5195 (YAG laser).

The photo-initiator, which is convertible by a photochemical reaction into a developer, is preferably an acylphosphine oxide or sulphide and/or a compound which generates acid when irradiated.

The compound which generates acid when irradiated is preferably an onium salt, a latent sulphonic acid, a halomethyl-s-triazine, or metallocene or a chlorinated acetophenone or a benzoin phenyl ether.

Preferred onium salt photoiniators are aryl diazonium, diaryliodonium; triaryl sulphonium, triaryl selenonium, dialkyl phenacyl sulphonium, triaryl sulphoxonium, aryloxydiaryl sulphoxonium and dialkylphenacyl sulphoxonium salts (especially their salts with $BF_4^-$, $PF_6^-$, $AsF_6^-$ or $SbF_6^-$), more preferably the diaryliodonium and triaryl sulphonium salts which are relatively easy to prepare on a commercial scale.

The latent sulphonic acid is a compound which produces a sulphonic acid on irradiation with light. Preferred latent sulphonic acids are the $\alpha$-sulphonyloxy ketones, e.g. benzoin tosylate, 4'-methylthio-2-(p-tosyloxy) propiophenone, $\alpha$-toluene sulphonyloxy propiophenone; $\alpha$-hydroxymethylbenzoin sulphonates, e.g. the methane sulphonate and p-toluene sulphonate of $\alpha$-hydroxymethyl benzoin; nitrobenzyl esters of sulphonic acids, e.g. 4-nitrobenzyl tosylate, 2,4- and 2,6-dinitrobenzyl tosylate, p-nitrobenzyl-9,10-diethoxyanthracene-2-sulphonate; aryl diazidonaphthaquinone-4-sulphonates; 4'-Nitrobenzyl 2,4, 6-triisopropylbenzenesulphone, $\alpha$-sulphonyl acetophenones, e.g. $\alpha$-toluene sulphonyl acetophenone and 2-methyl-2-(4-methylphenyl sulphonyl)-1-phenylpropane; methane sulphonate esters of 2-hydroxy- and 2,4-dihydroxybenzophenone; and 1,2,3,4-tetrahydro-1-naphthylideneimino-p-toluene sulphonate.

Preferred halo methyl-s-triazines are the 2-aryl-4,6-bis chloromethyl-s-triazines and preferred chlorinated acetophenones include 4-tert-butyl-$\alpha,\alpha,\alpha,$-trichloroacetophenone and 4-phenoxy-$\alpha,\alpha$-bis-dichloroacetophenone.

A preferred metallocene is (cyclopentadi-1-enyl)[(1,2,3, 4,5,6-n)-(1-methylethyl)benzene]-iron(1+)-hexafluoro phosphate (1–), available from Ciba Geigy 261.

The compound which forms colour or changes colour on contact with a photochemically generated developer is preferably a triaryl methane-, diphenyl methane-, thiazine, spiro-, lactam- or fluoran-based colour former. Examples of Triarylmethane-based colour formers include, 3-3-bis(p-dimethylaminophenyl)-6-dimethylaminophthalide, 3,3-bis (p-dimethylaminophenyl)phthalide, 3-(p-dimethylaminophenyl)-3-(1,2-dimethylindole-3-yl) phthalide, 3-(p-dimethylaminophenyl)-3-(2-methylindole-3-yl)phthalide, 3,3-bis(1,2-dimethylindole-3-yl)-5-dimethylaminophthalide, 3,3-bis(1,2-dimethylindole-3-yl)-6-dimethylaminophthalide, 3,3-bis(9-ethylcarbazole-3-yl)-6-dimethylaminophthalide, 3,3-bis(2-phenylindole-3-yl)-6-dimethylaminophthalide, 3-p-dimethylaminophenyl-3-(1-methylpyrrole-3-yl)-6-dimethylaminophthalide, etc., especially triphenyl methanes e.g. Crystal Violet Lactone.

Diphenylmethane-based colour formers include 4,4'-bis-dimethylaminobenzhydryl benzyl ether, N-halophenyl-leucoauramine and N-2,4,5-trichlorophenyl-leucoauramine.

Thiazine-based colour formers include benzoyl-leucomethylene blue and p-nitrobenzoyl-leucomethylene blue.

Spiro-based colour formers include 3-methyl-spiro-dinaphthopyran, 3-ethyl-spiro-dinaphthopyran, 3-phenyl-spirodinapthopyran, 3-benzyl-spiro-dinaphthopyran, 3-methyl-naphtho-(6'-methoxybenzo)spiropyran and 3-propyl-spiro-dibenzopyran.

Lactam-based colour formers include rhodamine-b-anilinolactam, rhodamine-(p-nitroanilino)lactam and rhodamine-(o-chloroanilino)lactam.

Fluoran-based colour formers include 3,6-dimethoxyfluoran, 3,6-diethoxyfluoran, 3,6-dibutoxyfluoran, 3-dimethylamino-7-methoxyfluoran, 3-dimethylamino-6-methoxylfluoran, 3-dimethylamino-7-methoxyfluoran, 3-diethylamino-7-chlorofluoran, 3-diethylamino-6-methyl-7-chlorofluoran, 3-diethylamino-6,7-dimethylfuoran, 3-(N-ethyl-p-toluidino)-7-methylfluoran, 3-diethylamino-7-(N-acetyl-N-methylamino)fluoran, 3-diethylamino-7-N-methylaminofluoran, 3-diethylamino-7-dibenzylaminofluoran, 3-diethylamino-5-methyl-7-dibenzylaminofluoran, 3-diethylamino-7-(N-methyl-N-benzylamino)fluoran, 3-diethylamino-7-(N-chloroethyl-N-methylamino)fluoran, 3-diethylamino-7-diethylaminofluoran, 3-(N-ethyl-p-toluidino)-6-methyl-7-phenylaminofluoran, 3-(N-ethyl-p-toluidino)-6-methyl-7-phenylaminofluoran, 3-diethylamino-7-(2-carbomethoxy-phenylamino)fluoran, 3-(N-ethyl-N-isoamylamino)-6-methyl-7-phenylaminofluoran, 3-(N-cyclohexyl-N-methylamino)-6-methyl-7-phenylaminofluoran, 3-pyrrolidino-6-methyl-7-phenylaminofluoran, 3-piperidino-6-methyl-7-phenylaminofluoran, 3-diethylamino-6-methyl-7-xylidinofluoran, 3-diethylamino-7-(o-chlorophenylamino)fluoran, 3-dibutylamino-7-(o-chlorophenylamino)fluoran and 3-pyrrolidino-6-methyl-7-p-butylphenylaminofluoran.

Colour formers permitting the production of a wide range of colours are known and have been described, for example, by Peter Gregory in High-Technology Applications of Organic Colorants, Plenum Press, pages 124–134.

The latent sulphonic acid 4'-nitrobenzyl 2,4,6-triisopropyl-benzenesulphonate [$4NO_2$—$C_6H_4CH_2OSO_2$—$(2,4,6Me_2CH—)C_6H_2$] may be prepared by reacting 4-nitrobenzyl-alcohol with triisopropylbenzenesulphonyl chloride in the presence of dicyclohexylamine.

The mechanical properties of the polymeric layer or three dimensional article may also be improved by irradiation with light which does not cause colouration, e.g. light of high (i.e. long) UV wavelength. If desired a photoinitiator which does not generate acid when irradiated may be included which absorbs the high UV wavelength light, thereby facilitating a "post cure" using high UV wavelength light without unwanted colour formation. This post cure can be performed on the polymeric layer or three dimensional article using an appropriate U.V. oven.

The photo-curable, photo-colourable composition preferably compromise:

(a) 100 parts in total of photo-curable (cationic or free radically initiated) resin;

(b) 0.01 to 5 parts microencapsulated colourants;

(c) 0 to 5 parts longer wavelength photo-initiators and or peroxides;

(d) 0 to 5 parts additives such as dispersing aid.

Microencapsulated compositions with different colour former system are suggested for the use in a photocurable, photocolourable composition to provide multicolour image.

The second colour may be developed at different energy wave-length to that used for the first colour and so on. In the present case the necessary dose of light from a single light source can be varied by varying the amount of a UV barrier agent coencapsulated with the colour former and colour developer and/or by varying the type of coencapsulated colour developer with a given colour former. Alternatively the energy may be varied by using different light sources.

The process for forming a three-dimensional article preferably uses a stereolithography apparatus, for example the SLA 250, 350, 500, 3500, 5000 supplied by 3D-Systems or the Stereos 300, 400 and 600 supplied by EOS.

There is no particular limit on what the three dimensional article having selectively coloured regions can be, for example one may use the process to form ornamental and industrial articles and models of plant and animal parts (e.g. human body parts). industrial articles include mechanical parts, especially those used in automobiles. Animal parts include bones, organs, tissues and combinations thereof. Examples of bones include joints (e.g. ball and socket joints such as the hip and shoulder, hinge joints such as the knee and elbow) the skull, jaw, spine, ribs, collarbone, shoulder blade, humerus, radius, ulna, teeth, finger and hand bones, breast bone, femur, tibia and fibula. Examples of organs include the liver, heart, lungs, kidneys, bladder, brain, eyes, intestines, pancreas and reproductive organs. Examples of tissue include muscle and cartilage. The process is particularly useful for producing selectively coloured models of animal parts and these can be used by a technician to assess the extent of certain illnesses and other disorders, or as a model for a surgeon to practice on before beginning surgery. For example, models of cancerous body parts can be produced wherein cancerous cells are coloured differently from healthy tissue. A surgeon can then practice or plan surgery using the model before beginning work on the patient.

As desired the three dimensional article having selectively coloured regions can be a model which is the same size, smaller or larger than the original article. Selectively coloured models which are larger than the original article are particularly useful for viewing small complicated internal features.

In a further embodiment the process comprises the further step of coating the polymeric layer or three dimensional article resulting from the present process with a visually transparent layer which absorbs the wavelength of light used in step b). This has the advantage of filtering out any light which could generate further unwanted colour, e.g. sunlight. A still further advantage is that the coating provides improved gloss and transparency and reduces or eliminates the "staircase" effect seen on three dimensional models prepared in a layer-wise manner.

The visually transparent coating preferably absorbs ultraviolet (UV) light. Materials used to prepare such coatings can be made by dissolving a UV absorbing compound in a mixture comprising a resin and one or more organic solvents, for example those UV absorbing compounds used in protective sun creams or Tinuvin 1135 and 400 available from Ciba Geigy, Bayer 325 and 340 available from Bayer PLC, and UV.Titan grade P370 and L530 available from Kemira of Finland. Suitable resins are thermoplastic acrylic resins, e.g. Neocryl B700 and B731 from Zeneca Limited.

The visually transparent coating is preferably applied to the polymeric layer or three dimensional article by dip or spray coating. With dip coating the depth of layer may be controlled by altering viscosity of the material used, with layer depth increasing with viscosity.

EXAMPLE 1

Preparation of a Microencapsulated Colorant Composition DBS97/47

An oil phase was made by mixing together 1.15 parts butylated urea formaldehyde resin (Beetle-80 ex Cytec), 0.75 parts pentaerythritol tetra (3-mercaptopropionate ex Aldrich), 0.2 parts colour former 3,3-(Bis(1-octyl-2-, methylindol-3yl)phthalide (Pergascript Red 1-6B ex Ciba Giegy) and 0.1 parts colour developer 4-nitrobenzyltosylate (NB-201 ex Midori Kagfaku Co Ltd) and 7.8 parts solvent (Solvesso-200 ex Exxon).

The oil phase was added at room temperature to a stirred (3000 rpm) solution at pH 9.1 containing 0.4 parts of sulphonated colloid stabiliser (Lomar-D ex Henkel), 0.02 parts and sulphonated alkyl naphthalene (Petro-BAF ex Witco) in 19.6 parts of distilled water. The stirring rate was increased to 6000 rpm for 5 minutes. The pH was then reduced to 1.9 by the addition of dilute HCl. The emulsion was stirred at 100 rpm and the temperature was raised to 50° C. Stirring was continued at this temperature for 3 hours affording red micro-capsules with an average particle size of about 11 microns. The red colouration was removed by the drop-wise addition of ammonia.

The capsule suspension was diluted by about two to three times with water and was forced by nitrogen through the nozzle head of a Model 190 Buchi Mini Spray Dryer Unit with the inlet at about 140° C. and the outlet at about 70° C. A colourless powder was obtained in 45% yield. In a similar manner to above a number of different micro-encapsulated colourant compositions were produced with the different level and type of colour developers as given in Table 1.

TABLE 1

Selected encapsulated colorant compositions

| Samples Ref. | Colour Developer (CD) | Ratio of CF:CD (%) | Level of CF in Caps |
|---|---|---|---|
| DBS97/47 | 4-nitrobenzyl tosylate NB 201 | 01:01 | 2% W/W |
| DBS97/77 | Zeneca TIBO2 | 01:01 | 2% W/W |
| DBS97/78 | Zeneca TIBO2 | 01:02 | 2% W/W |

Zeneca TBO2 is a novel colour developer having the composition 4'-nitrobenzyl 2,4,6-triisopropylbenzenesulphonate;
NB 201 is commercial photoinitiator (ex Midori Kagaku Co Ltd);
CF = Colour former Pergascript Red I-6B.

EXAMPLE 2

Effect of Micro-capsules on Rheological and Mechanical Properties of Base Resin

Using commercial acrylate and epoxy resin various formulations were prepared by adding colourless microencapsulated colourant composition and mixing with a vibro mixer for 2 hours. The resulted formulation was a clear liquid with well dispersed microcapsule particles in the resin.

For selected photopolymer resins viscosity was measured using a Brookfield viscometer with controlled temperature and spindle number 27 at 100 rpm. Table 2 gives the comparison with base resin measured on the same day.

For mechanical properties measurements, 1 mm thick tensile dumbbell samples were prepared and measured as given in ASTM D630. Samples were cured using a UV oven ("Parker" 300 w/in "H" lamp) at cure energy of 2.57 and 5.44J/cm², as shown in Table 2 below. No significant change in mechanical properties or viscosity was found due to addition of microcapsules to photopolymer resin.

TABLE 2

| Sample | Viscosity (CPS) | Tensile Modulus (MPa) | | Tensile Strength (MPa) | | Elongation (%) Energy (J/cm²) | |
|---|---|---|---|---|---|---|---|
| | | 2.57 | 5.44 | 2.57 | 5.44 | 2.57 | 5.44 |
| Commercial Epoxy Cibatool XB 5170 | 190 | 1094 | 1059 | 60.4 | 49.8 | 9.7 | 8.0 |
| AHPCE471 Cibatool XB 5170 + 1% DBS97/47 | 195 | 943 | 1095 | 54.6 | 57.6 | 9.3 | 8.2 |
| Commercial Acrylate Stereocol H—N 9000 | 1040 | 783 | 882 | 27.2 | 34.4 | 4.4 | 5.2 |
| AHPZP471 Stereocol H—N 9000 + 1% DBS97/47 | 1150 | 736 | 853 | 35.2 | 37.9 | 6.7 | 6.0 |

EXAMPLE 3

Colourability of Formulated Resins with Encapsulated Colorants

Colourability of selected colourable resin formulations containing encapsulated colourants is given in Table 3. Colour was measured on 2 dimensional single layer film produced by a stereolithography machine (SLA 250, ex 3D Systems, USA) fitted with 25 mw He—Cd laser and further post cured with a UV lamp Philips TLK 40W/05. Colour was measured using Minolta CR200 Chroma Meter by standard CIE (Commission Internatinale de l'Eclairage) 1976, L *a*b method.

TABLE 3

Colourability of commercial epoxy resin (Cibatool XB 5170) formulated with microcapsules with laser and postcure lamp

| | He—Cd Laser | | UV Lamp |
|---|---|---|---|
| Sample | Min. Colour Low Energy | Max. Colour High Energy | Max. Colour |
| Colourable Epoxy | (red units) | (red units) | (red units) |
| Cibatool XB 5170 + 1% w/w DBS97/47 | 2.1 | 13.6 | 22.6 |
| Cibatool XB 5170 + 1% w/w DBS97/77 | 3.5 | 10 | 23.6 |
| Cibatool XB 5170 + 2% w/w DBS97/77 | 6.2 | 18.2 | 41.8 |
| Cibatool XB 5170 + 1% w/w DBS97/78 | 4.9 | 12.2 | 25.8 |

By "low energy" is meant the energy used to cure the resin, by "high energy" is meant five times the low energy and the UV lamp energy was sufficient to produce full development of the colour.

The difference in colour achieved at low and high laser power indicates that the encapsulated colourants are suitable for the use in epoxy resin to give selective colouration. As shown for two laser energies, the optical density of colour formed increases with the increase in the energy dose with the same He—Cd laser at 325 nm output. The maximum colour achieved with the UV lamp suggest that colouring two dimensional film with lamp is possible and that the amount of optical density of colour achieved further increases with additional energy.

EXAMPLE 4

Concentration Effect of Microcapsules DBS97/77 on the Cure Properties of Resin

A photocurable, photocurable composition was prepared by adding and mixing microcapsules DBS97/77 in a commercial epoxy resin Cibatool XB 5170 (available from 3 D Systems) at 1 and 2% w.w of Cibatool resin. The formulation was loaded into the vat of a standard Stereolithography machine fitted with He—Cd laser (SLA 250 supplied by 3 D System, USA). The resin parameters were measured by building standard window pane single layer parts and calculating Ec and Dp as given in Table 4.

Ec is critical energy at which polymer is at "gel point" corresponding to the transition from liquid to the solid phase. Dp is the "penetration depth" of the resin, defined as the depth of resin which results in a reduction in the irradiance to a level equal to 1/e of the surface irradiance, where e=2.718 . . . , the base of natural logarithms. Single polymeric layers were prepared using different scan speed to vary the UV dose. It was found that below a UV dose of 80 mJ/cm² the polymeric layer was essentially colourless to the naked eye and above this dose the layer became noticeably red, with the intensity of colour increasing with energy dose using the same He—Cd laser at 325 nm output. Therefore the composition can be used to prepare three dimensional articles having selectively coloured regions using the low dose to cure uncoloured regions and the high dose to colour and cure selected coloured regions.

TABLE 4

SLA 250 He—Cd laser data for formulation with 1 and 2% w/w microcapsule DBS97/77

| Sample Ref | Ec (mJ/cm²) | Dp (mm) |
|---|---|---|
| Cibatool XB 5170 | 13.5 | 0.122 |
| Cibatool XB 5170 + 1% DBS97/77 | 20.6 | 0.114 |
| Cibatool XB 5170 + 2% DBS97/77 | 23.9 | 0.102 |

EXAMPLE 5

Example 2 was repeated, except that the microcapsules DBS97/77 were dispersed in commercial acrylate resin Stereocol H-N 9000 (available from ZENECA) at 1% w/w resin. The photocurable, photocolourable acrylate resin sample was tested similarly as in Example 4 using a stereolithography machine (SLA 250) equipped with He—Cd laser. The processing parameters were Ec 2.8 mJ/cm² and Dp 0.086 mm.

EXAMPLE 6

Evaluation of Zeneca Synthethised Color Developer vs Commercial Color Developer

A sample containing a commercial epoxy resin and microcapsules was prepared as in Example 2. The resulting photocurable, photocolourable epoxy sample was tested in a stereolithography machine (SL 250) fitted He—Cd laser at 325 nm. The effect of different colour developers in microcapsule compositions on the cure properties of the formulated resin was measured and is shown in Table 5.

TABLE 5

| Sample | Ec (mJ/cm$^2$) | Dp (mm) |
|---|---|---|
| Cibatool XB 5170 | 13.5 | 0.122 |
| Cibatool XB 5170 + microcapsules DBS 97/47 | 29.0 | 0.114 |
| Cibatool XB 5170 + microcapsules DBS97/77 | 20.6 | 0.114 |

Zeneca colour developer has less effect on resin cure properties (laser processing parameters Ec and Dp) when microcapsules containing this colour developer is added to the base resin.

What is claimed is:

1. A process for producing a polymeric layer having a desired image thereon or a three dimensional article comprising a number of such layers, which process comprises curing by light at least one layer of a liquid photocurable composition, which composition comprises a photocurable resin, a first photo initiator, and photo colourable particles dispersed in the composition, and either simultaneously or subsequently irradiating selected areas of said at least one layer with light of a different dose, thereby initiating the photo colourable particles to form the desired image, wherein said photo colourable particles are
   (a) micro-capsules comprised of a photosensitive colour changing composition and a barrier layer that is substantially impermeable to the components of the colour changing composition; or
   (b) solid particles comprised of said photosensitive colour changing composition in immobilised form; or
   (c) solid particles comprised of the micro-capsules of element (a) in immobilised form;
wherein the colour changing composition comprises a colour former and a second photo initiator, said first and second photo initiators may be the same or may be different.

2. The process of claim 1 wherein the first and second photo initiators are cationic photo initiators.

3. The process of claim 1 further comprising the step of post curing with light in an ultra violet oven the polymeric layer or three dimensional article having a desired image thereon.

4. The process of claim 3 wherein said photocurable composition further comprises an additional photo initiator that absorbs high ultra violet wavelength light but does not generate an acid when irradiated, and facilitates said post cure of the resin without unwanted colour formation.

5. The process of claim 1 wherein the second photo initiator is sensitive to the light used for curing said at least one layer, and wherein the photo colourable particles further comprise a light absorbing substance that absorbs at least part of said light used for curing whereby the colour changing composition is not prematurely initiated.

6. The process of claim 5 wherein the photo colourable particles comprise micro-capsules and the light absorbing substance is present within the micro-capsule and/or the barrier layer.

7. The process of claim 1 wherein the second photo initiator is a cationic photo initiator and the photo colourable particles further comprise an alkali capable of neutralising cations initially produced by the first photo initiator.

8. The process of claim 1 wherein the colour changing composition comprises a cationic photo initiator and an alkaline substance present in a quantity sufficient to neutralize some but not all of the cations producible by the first photo initiator whereby the colour changing composition is not prematurely initiated.

9. The process of claim 1 wherein the photo colourable particles are micro-capsules treated with ammonia to decolourise and/or provide a reserve alkalinity in the particle.

10. The process of claim 1 wherein the photo colourable particles are micro-capsules and the barrier layer of said micro-capsules is sufficiently robust to resist rupture by pressure or exposure to light or when the particles are mixed with said photocurable resin and subjected to photo initiation.

11. The process of claim 1 wherein said photo colourable particles are micro-capsules and said barrier layer is sufficiently robust to remain intact in the finished product after colour formation.

12. The process of claim 1 wherein said photo colourable particles further comprise an ultra violet stabiliser.

13. The process of claim 12 wherein the photo colourable particles are micro-capsules and the ultra violet stabiliser is a component of the barrier layer of said micro-capsules.

14. The process of claim 1 wherein said photo colourable particles comprise a colour stabiliser.

15. The process of claim 1 wherein said photo colourable particles are micro-capsules and said barrier layer has an average diameter of about 1 to 50 microns.

16. The process of claim 1 wherein said photo colourable particles are micro-capsules and wherein the thickness of said barrier layer comprises 15 to 50% of the diameter of the photo colourable particles.

17. The process of claim 1 wherein said photo colourable particles are micro-capsules and said barrier layer is an aminoplast composition.

18. The process of claim 1 further comprising the step of producing said micro-capsules of said photo colourable particles by spray drying an aqueous micro-capsule suspension and evaporating water therefrom.

19. The process of claim 1 wherein the photo colourable particles are micro-capsules and the colour changing composition is in a liquid phase enclosed by said barrier layer.

20. The process of claim 1 wherein said colour changing composition comprises more than one colour former, each colour former is activated at different irradiation doses thereby providing a multi-colour image in a final product when said selected areas of said at least one layer are irradiated with light at said different wavelengths or said different doses.

21. The process of claim 1 wherein the dose of light used to irradiate selected areas of said at least one layer differs in intensity, duration or wavelength from the dose of light used for curing said at least one layer.

22. The process of claim 1 wherein the light used to cure said at least one layer and the light used to irradiate selected areas of said at least one layer comes from a single source.

23. The process of claim 1 wherein the colour former is initiated and thereby coloured, changes colour, increases its intensity of colour or is bleached upon activation of said second photo initiator.

24. The process of claim 1 further comprising dip or spray coating the polymeric layer or three dimensional article having said desired image thereon with a visually, transparent layer that absorbs light capable of generating further colour change.

25. The process of claim 1 wherein said desired image is a stereolithographic image.

26. The process of claim 1 wherein said photo colourable particles are micro-capsules comprised of a photosensitive colour changing composition and a barrier layer that is substantially impermeable to the components of the colour changing composition.

27. A product produced by the process according to claim 1.

* * * * *

UNITED STATES PATENT AND TRADEMARK OFFICE
CERTIFICATE OF CORRECTION

PATENT NO. : 6,649,311 B1
APPLICATION NO. : 09/744229
DATED : November 18, 2003
INVENTOR(S) : Dianne Beth Shirley et al.

It is certified that error appears in the above-identified patent and that said Letters Patent is hereby corrected as shown below:

Column 2, line 32 should read –greeting—

Column 4, line 18 should read –6,7,-dimethylfluoran—

Column 4, line 49 should read –coloration—

Column 4, line 58 should read –comprises—

Column 6, line 10 should read –Geigy—

Column 6, line 16 should read –parts of sulphonated—

Column 8, line 12 should read – A photocurable, photocolourable composition--

Signed and Sealed this

Twenty-second Day of August, 2006

JON W. DUDAS
*Director of the United States Patent and Trademark Office*